(12) United States Patent
Lin et al.

(10) Patent No.: US 7,239,489 B2
(45) Date of Patent: Jul. 3, 2007

(54) TUNNELING MAGNETORESISTIVE (TMR) SENSOR HAVING A MAGNESIUM OXIDE BARRIER LAYER FORMED BY A MULTI-LAYER PROCESS

(75) Inventors: Tsann Lin, Saratoga, CA (US); Daniele Mauri, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/900,487

(22) Filed: Jul. 28, 2004

(65) Prior Publication Data

US 2005/0009211 A1 Jan. 13, 2005

Related U.S. Application Data

(62) Division of application No. 10/304,841, filed on Nov. 25, 2002, now Pat. No. 6,841,395.

(51) Int. Cl.
*G11B 5/39* (2006.01)
(52) U.S. Cl. .................................................. 360/324.2
(58) Field of Classification Search .............. 360/324.2
See application file for complete search history.

(56) References Cited

U.S. PATENT DOCUMENTS

| | | | | |
|---|---|---|---|---|
| 5,835,314 A * | 11/1998 | Moodera et al. | ......... | 360/324.2 |
| 6,219,274 B1 * | 4/2001 | Shimazawa et al. | . | 257/E43.006 |
| 6,335,081 B1 * | 1/2002 | Araki et al. | ................ | 360/313 |
| 6,347,049 B1 * | 2/2002 | Childress et al. | ........ | 360/324.2 |
| 6,452,204 B1 * | 9/2002 | Ishiwata et al. | ......... | 360/324.2 |
| 6,600,184 B1 * | 7/2003 | Gill | ............................ | 257/295 |
| 2002/0006020 A1 * | 1/2002 | Hasegawa | ................ | 360/324.2 |

* cited by examiner

Primary Examiner—Craig A. Renner
(74) Attorney, Agent, or Firm—Zilka-Kotab, PC (57) ABSTRACT

A tunneling magnetoresistive (TMR) sensor includes a first ferromagnetic (FM) layer (e.g. a sense or reference layer), a barrier layer formed over the first FM layer, and a second FM layer (e.g. a sense or reference layer) formed over the barrier layer. The barrier layer is made of magnesium-oxide (Mg—O). The sense and reference layers of the TMR sensor exhibit controlled magnetic properties, the barrier layer provides a low junction resistance-area product, and the TMR sensor exhibits a high TMR coefficient. The junction resistance is sufficiently low so as to prevent electrostatic discharge (ESD) damage to submicron-sized TMR sensors used for magnetic recording at ultrahigh densities.

20 Claims, 11 Drawing Sheets

TUNNELING MAGNETORESISTIVE (TMR) SENSOR HAVING A MAGNESIUM OXIDE BARRIER LAYER FORMED BY A MULTI-LAYER PROCESS

CROSS-REFERENCE TO RELATED APPLICATION

This application is a divisional application of U.S. patent application having Ser. No. 10/304,841 filed on Nov. 25, 2002 now U.S. Pat. No. 6,841,395 entitled "Method Of Forming A Barrier Layer Of A Tunneling Magnetoresistive Sensor".

BACKGROUND OF THE INVENTION

1. Field of the Invention

This invention relates generally to a tunneling magnetoresistive (TMR) sensor and methods of making the same, and more particularly relates to a method of forming a barrier layer of the TMR sensor which includes a three-step barrier-layer formation process.

2. Description of the Related Art

Figure 1:
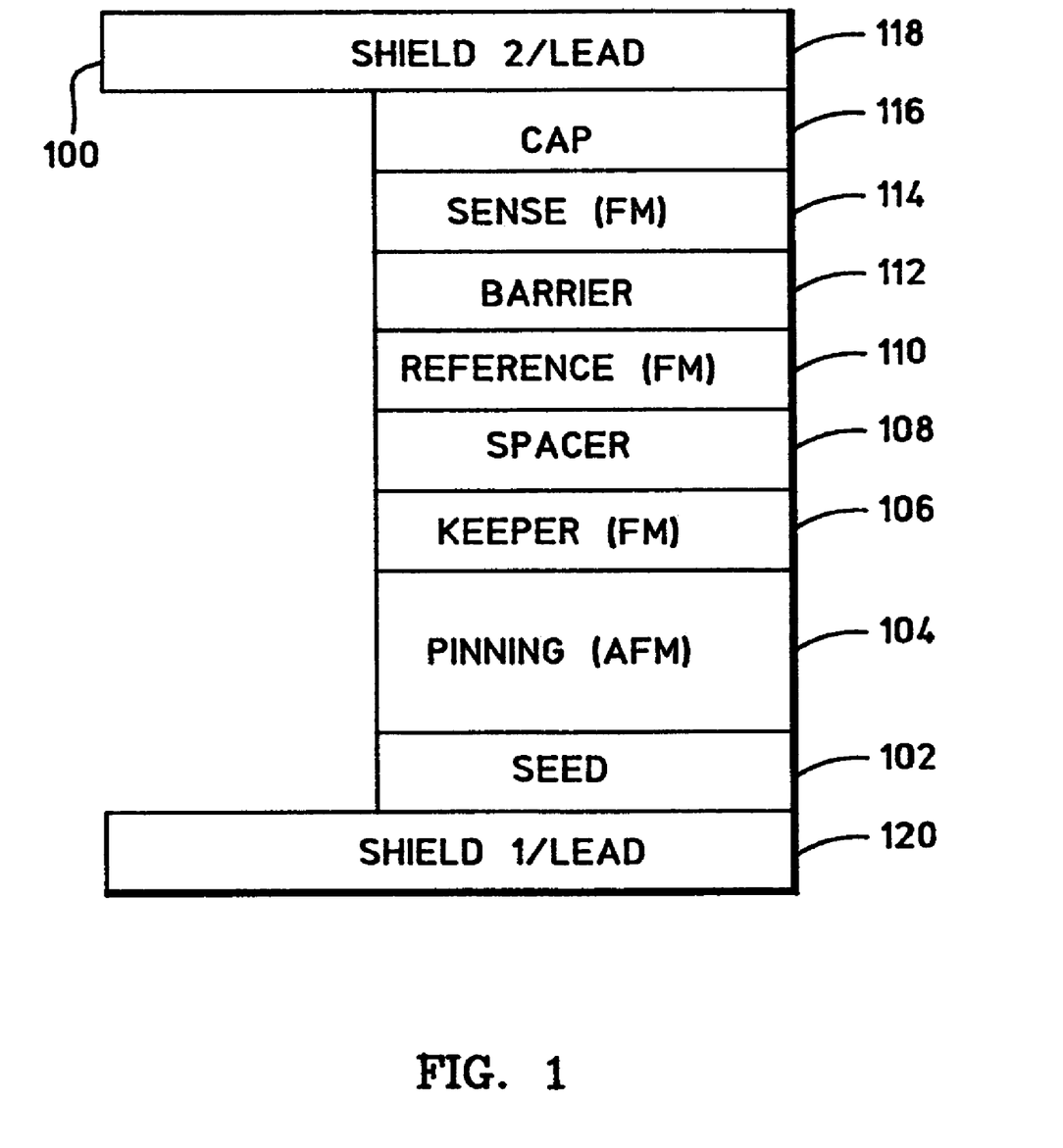
FIG. 1 is a cross-sectional illustration of typical multi-layered structure of a tunneling magnetoresistive (TMR) sensor.

FIG. 1 is a cross-sectional illustration of a tunneling magnetoresistive (TMR) sensor 100. TMR sensor 100 may include a tantalum (Ta) seed layer 102, an antiferromagnetic (AFM) platinum-manganese (Pt—Mn) pinning layer 104, a ferromagnetic (FM) cobalt-iron (Co—Fe) keeper layer 106, a ruthenium (Ru) spacer layer 108, an FM cobalt-iron (Co—Fe) reference layer 110, an insulating aluminum-oxide (Al—O) barrier layer 112, FM cobalt-iron/nickel-iron (Co—Fe/Ni—Fe) sense layers 114, copper/tantalum (Cu/Ta) cap layers 116, and shield/layers 118, 120. Sense layers 114 may be referred to as free layers, and keeper and reference layers 106 and 110 may be referred to as first and second pinned layers, respectively. Such a TMR sensor 100 differs from a commonly used giant magnetoresistive (GMR) sensor in that barrier layer 112 replaces a conducting copper (Cu) spacer layer. In contrast to the GMR sensor which exhibits GMR effects upon applying a sense current in a direction parallel to film planes, TMR sensor 100 exhibits TMR effects upon applying the sense current in a direction perpendicular to film planes.

In TMR sensor 100 of FIG. 1, antiferromagnetic/ferromagnetic coupling occurs between pinning and keeper layers 104 and 106, producing a unidirectional anisotropy field ($H_{UA}$). Ferromagnetic/ferromagnetic antiparallel (AP) coupling also occurs within Co—Fe/Ru/Co—Fe pinned layers 106, 108, and 110, producing a spin-flop field ($H_{SF}$) and an AP saturation field ($H_S$). Due to these fields, the magnetization of keeper layer 106 ($M_3$) is pinned in a transverse direction perpendicular to an air bearing surface (ABS) and that of reference layer 110 ($M_2$) is pinned in an opposite direction. The lowest of the three fields, defined as a pinning field ($H_P$), must be high enough to ensure rigid pinning for proper sensor operation.

Ferromagnetic/ferromagnetic coupling also occurs across barrier layer 112, producing a ferromagnetic (FM) coupling field ($H_F$). This $H_F$ must be balanced by a demagnetizing field ($H_D$), which is induced by the net magnetization of reference and keeper layers ($M_2$-$M_3$) in sense layers 114, in order to orient the magnetization of sense layers 114 ($M_1$) in a longitudinal direction parallel to the ABS and thereby ensure optimal TMR responses. With this field balance, TMR sensor 100 exhibits a resistance of $R_J+(\frac{1}{2})\Delta R_T$, where $R_J$ is a junction resistance measured when $M_1$ is parallel to $M_2$, and $\Delta R_T$ is the maximum tunneling magnetoresistance measured when $M_1$ is antiparallel to $M_2$. During operation of TMR sensor 100, $M_1$ rotates in response to signal fields while $M_2$ and $M_3$ remain unchanged. This $M_1$ rotation causes a change in the resistance of TMR sensor 100 by $-(\Delta R_T/R_J) R_J \sin \theta_1$, where $\Delta R_T/R_J$ is a TMR coefficient and $\theta_1$ is an $M_1$ rotation angle.

In a prior art fabrication process of TMR sensor 100, barrier layer 112 is typically formed by depositing a metallic film and oxidizing the film in air or an oxygen gas. Optimal oxidation is essential for a TMR sensor 100 to attain good magnetic and TMR properties. Oxidation in air results in TMR sensor 100 with a junction resistance-area product ($R_J A_J$) of beyond 1000 Ω-μm² and a $\Delta R_T R_J$ of beyond 30%. Oxidation in an oxygen gas of 10 Torr results in TMR sensor 100 having an $R_J A_J$ of beyond 10 Ω-μm² and a $\Delta R_T R_J$ of beyond 20%. Unfortunately, such TMR sensors cannot be used in practice as submicron-sized read sensors for magnetic recording at high densities, since $R_J A_J$ must be around 4 Ω-μm² in order to prevent electrostatic discharge (ESD) damage to the sensors.

Figure 2:
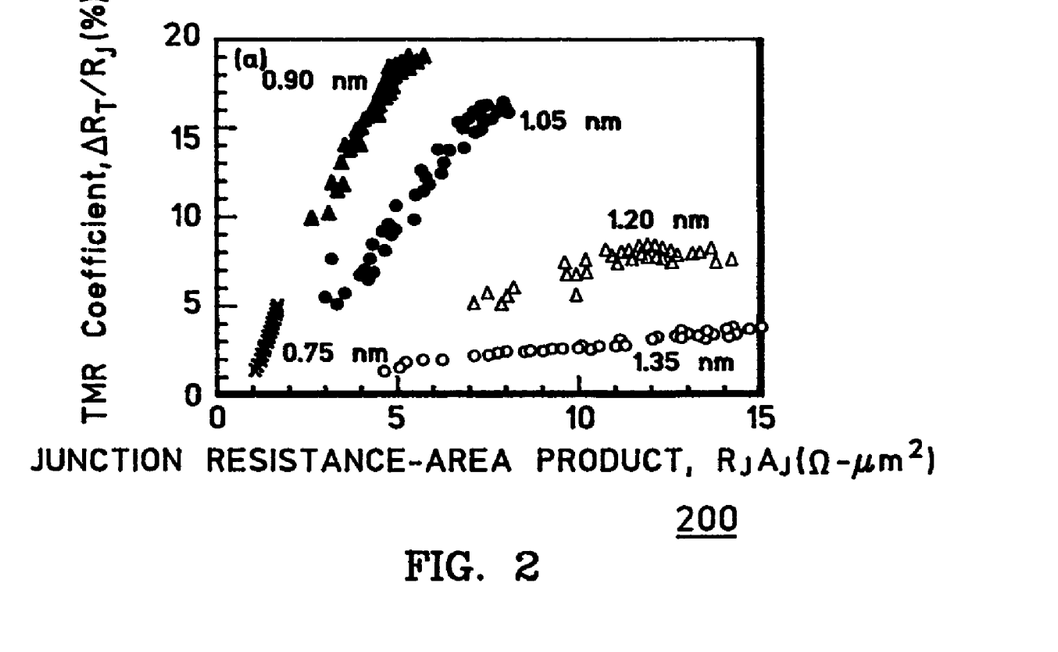
FIG. 2 shows a graph of data points of $\Delta R_T/R_J$ versus $R_J A_J$ for TMR sensors having various $\delta_{Al-O}$.
Figure 3:
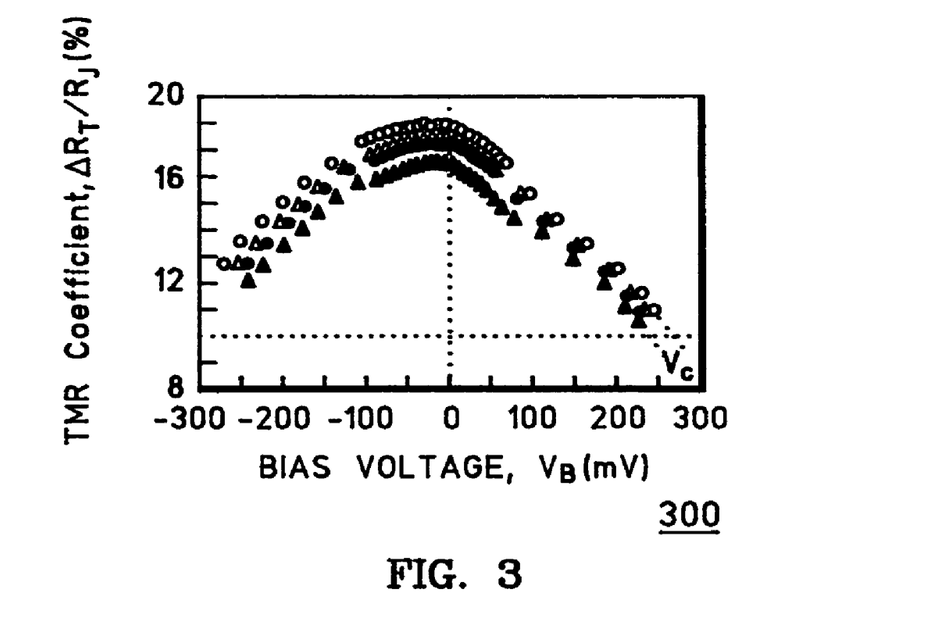
FIG. 3 shows a graph of data points of $\Delta R_T/R_J$ versus a bias voltage ($V_B$) for TMR sensors having various $\delta_{Al-O}$.

To illustrate further, FIG. 2 shows a graph 200 of $\Delta R_T/R_J$ versus $R_J A_J$ for TMR sensors having various Al—O barrier layer thicknesses ($\delta_{Al-O}$). With an optimal $\delta_{Al-O}$ of 0.90 nm, the TMR sensor exhibits an $R_J A_J$ ranging from 2.8 to 5.6 Ω-μm² and a $\Delta R_T/R_J$ ranging from 9.6 to 19.0%. A smaller $\delta_{Al-O}$ leads to a desired low $R_J A_J$, but also an undesired low $\Delta R_T/R_J$. A larger $\delta_{Al-O}$ leads to an unacceptably high $R_J A_J$ and a low $\Delta R_T/R_J$. FIG. 3 shows a graph 300 of $\Delta R_T/R_J$ versus a bias voltage ($V_B$) for TMR sensors having various $\delta_{Al-O}$. The thermal stability of the TMR sensor with an optimal $\delta_{Al-O}$ of 0.90 nm is characterized by a critical voltage ($V_C$) where the $\Delta R_T/R_J$ decreases to 10%. Its $V_C$ ranges from 238 to 264 millivolts (mV), indicating high thermal stability.

Accordingly, in order for a TMR sensor to perform magnetic recording at ultrahigh densities, further improvements in $R_J A_J$, $\Delta R_T/R_J$ and $V_C$ are needed.

SUMMARY OF THE INVENTION

A tunneling magnetoresistive (TMR) sensor according to one embodiment includes a first ferromagnetic (FM) layer (e.g. a sense or reference layer), a barrier layer formed over the first FM layer, and a second FM layer (e.g. a sense or reference layer) formed over the barrier layer. The barrier layer includes a first oxidized metallic film layer and a second oxygen-doped metallic film layer. In a preferred embodiment, each metallic layer of the barrier layer is made of magnesium-oxide (Mg—O).

BRIEF DESCRIPTION OF THE DRAWINGS

For a fuller understanding of the nature and advantages of the present invention, as well as the preferred mode of use, reference should be made to the following detailed description read in conjunction with the accompanying drawings (not shown to scale).

DETAILED DESCRIPTION OF THE PREFERRED EMBODIMENTS

The following description is the best embodiment presently contemplated for carrying out the present invention. This description is made for the purpose of illustrating the general principles of the present invention and is not meant to limit the inventive concepts claimed herein.

Figure 4:
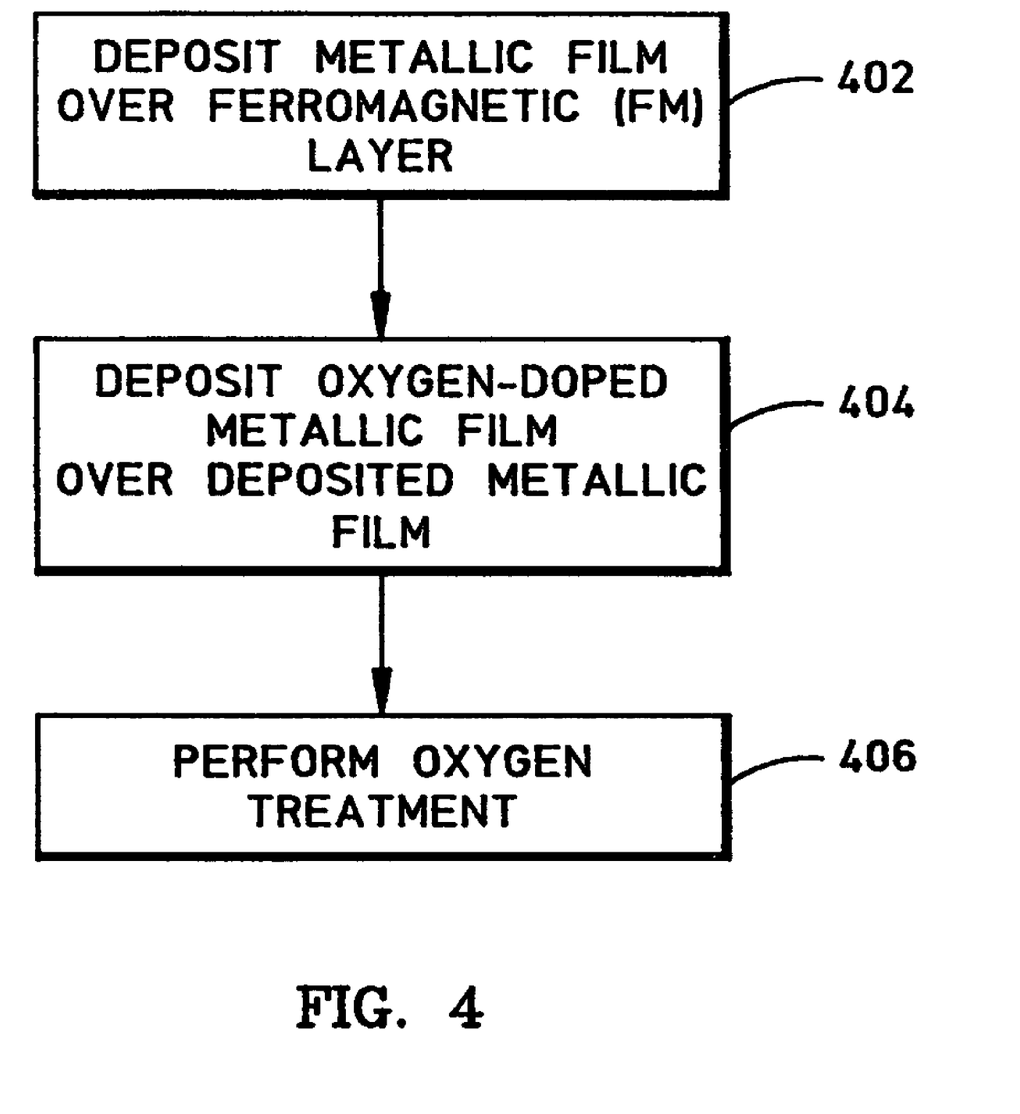
FIG. 4 is a flowchart which describes a method of forming a barrier layer of a TMR sensor.

FIG. 4 is a flowchart which describes a method of forming a barrier layer of a tunneling magnetoresistive (TMR) sensor. By making a TMR sensor with a barrier layer in accordance with the method described in relation to FIG. 4, the TMR sensor is provided with good magnetic and TMR properties. A barrier layer is typically formed over and on top of a ferromagnetic (FM) layer, such as the reference layer of a "bottom" TMR sensor comprising seed/pinning/keeper/spacer/reference/barrier/sense/cap layers, as shown in FIG. 1; or the sense layer of a "top" TMR sensor comprising seed/sense/barrier/reference/spacer/keeper/pinning/cap layers. The method of FIG. 4 begins with the formation of the barrier layer over the FM layer.

The three-step barrier-layer formation process generally includes the acts of depositing a metallic film over the FM layer (step 402); depositing an oxygen-doped metallic film over the deposited metallic film (step 404); and performing an oxygen treatment on the deposited films (step 406). Preferably, the metallic film is or includes magnesium (Mg). However, other metallic films may be suitable, such as aluminum (Al), boron (B), zinc (Zn), iron (Fe), hafnium (Hf), etc.

Step 402 of depositing the metallic film may be performed in a first module and step 404 of depositing the oxygen-doped metallic film is performed in a second module that is different from the first module. Also, the first module used to deposit the metallic film in step 402 is preferably the same module used to deposit the FM layer in a previous step. Preferably, the first module is a DC magnetron sputtering module and the second module is an ion beam sputtering module.

Figure 5:
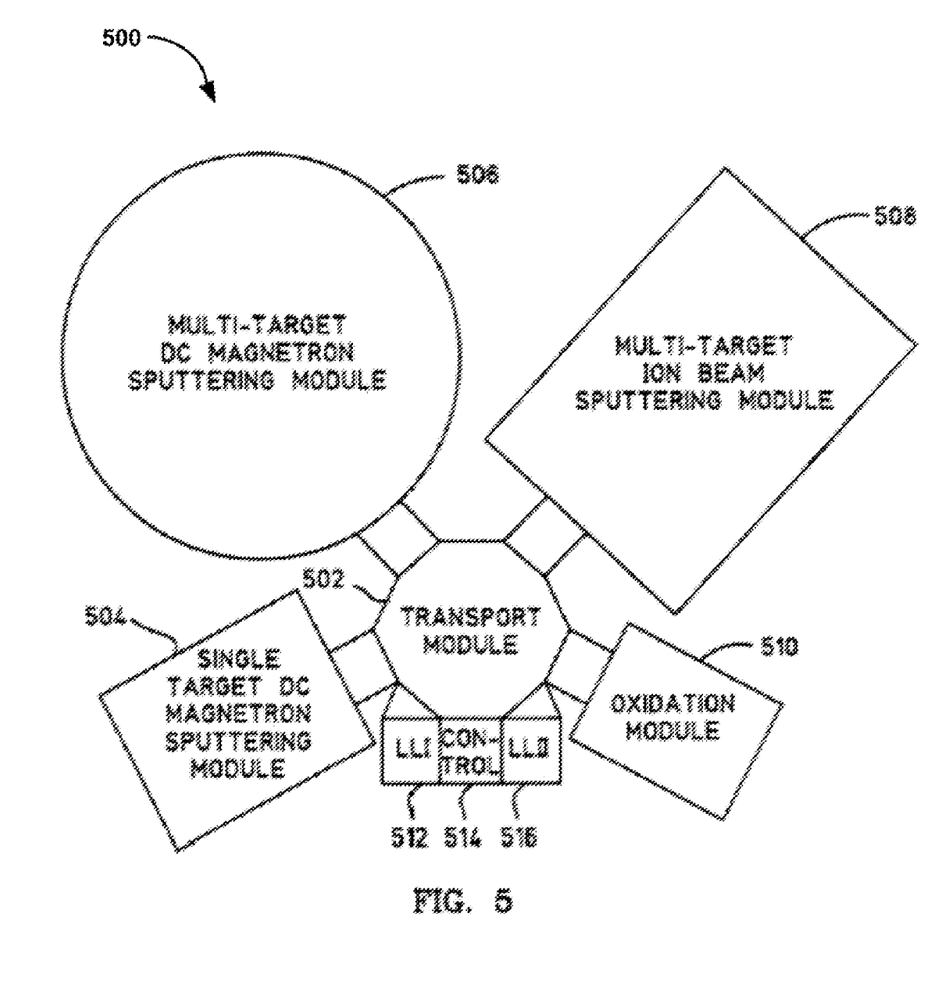
FIG. 5 is a top down view of a preferred sputtering system used in the method of FIG. 4 so that the resulting TMR sensor has good magnetic and TMR properties.

A sputtering system 500 illustrated in FIG. 5 may be used to perform the DC magnetron and ion beam reactive sputtering processes for the formation of barrier layer 112. Sputtering system 500 is an integrated DC-magnetron/ion-beam sputtering system which is believed to provide the best magnetic and TMR properties for a TMR sensor. Sputtering system 500 includes a control panel 514, two loadlocks 512 and 516, a transport module 502, a single-target DC magnetron sputtering module 504, a multiple-target DC magnetron sputtering module 506, a multiple-target ion-beam sputtering module 508, and an oxygen treatment module 510. One example of such sputtering, system 500 is commercially available from Veeco Instruments located in Plainview, N.Y., U.S.A.

In the first step 402 of FIG. 4, the metallic film is deposited on the reference layer of the TMR sensor (assuming a "bottom" type TMR sensor) in an argon gas of 3 mTorr in multiple-target DC magnetron sputtering module 506 of FIG. 5. It is preferred that a DC magnetron sputtering mode performed at high gas pressures be used in order to minimize atomic mixing at the interface between the reference and barrier layers. In this step, an ion-beam sputtering mode performed at low gas pressures is not recommended, as substantial atomic mixing at the interface between the reference layer and the barrier layer will lead to a low TMR coefficient During DC magnetron or ion beam sputtering, energetic gas particles bombard a target, causing atoms in the target to be sputtered away. When a high gas pressure is used, the sputtered atoms will frequently collide with gas particles in the sputtering module and bombard a growing film surface with low mobility, thus minimizing interface mixing. When a low gas pressure is used, the sputtered atoms will encounter much less collisions in the sputtering module and bombard the growing film surface with high mobility, thus maximizing interface mixing.

In the second step 404 of FIG. 4, an oxygen-doped metallic film is deposited in mixed xenon and oxygen gases of 0.12 and 0.04 mTorr, respectively, in multiple-target ion-beam sputtering module 508 of FIG. 5. An ion-beam reactive sputtering mode performed at low gas pressures is used to maximize interface mixing with the previously deposited metallic film. The oxygen partial pressure used for the ion beam reactive sputtering mode is low enough to just oxidize the underlying metallic film, without penetration into the ferromagnetic reference layer. The DC magnetron reactive sputtering mode is not recommended, since it requires at least a total pressure of 3 mTorr to ignite stable plasma for film deposition, leading to difficulties in minimizing collisions of few oxygen atoms in plasma and in controlling optimal oxygen doping into the bilayer films.

In the third step 406 of FIG. 4, an oxygen treatment is applied to the bilayer films in an oxygen gas of 0.5 Torr in oxygen treatment module 510 of FIG. 5. The oxygen treatment mode is used to cover some pinholes in the bilayer films, so that metallic shorting between the reference and sense layers can be prevented, and to saturate the oxidation condition on the surface of the bilayer films so that the sense layers can grow without oxygen incorporation.

Detailed Embodiment. In the fabrication process of the TMR sensor, the TMR sensor is deposited on a bottom FM Ni—Fe (~1 µm) shield layer in the integrated DC magnetron/ion beam sputtering system 500, annealed in a vacuum oven for 5 hours at 265° C., and patterned into a submicron width using photolithography. After the patterning, a longitudinal bias stack having $Al_2O_3$/Cr/Co—Pt—Cr/$Al_2O_3$ films is deposited on the two side regions. After connecting the TMR sensor with a top FM Ni—Fe (~1 μm) shield layer, the TMR sensor is mechanically lapped into a submicron height.

To characterize magnetic and TMR properties without surrounding magnetic effects, the bottom FM Ni—Fe shield layer is replaced by a bottom lead layer having Ta(3)/Cu (20)/Ta(3)/Cu(20)/Ta(9) films, while the top FM Ni—Fe shield layer is replaced by a top lead layer having Ta(6)/Au (180) films (thicknesses in nm). The bottom lead layer and a TMR sensor having Ta(6)/Pt—Mn(20)/Co—Fe(1.6)/Ru (0.8)/Co—Fe(1.8)/Mg—O(0.9)/Co—Fe(1)/Ni—Fe(1.6)/Cu (1)/Ta(12) films are sequentially deposited on an $Al_2O_3$(6) coated silicon (Si) substrate in the integrated DC-magnetron/ion-beam sputtering system 500 (FIG. 5). After annealing in a field of 10,000 Oersteds (Oe) in a transverse direction for 5 hours at 265° C. in the high vacuum oven, the magnetic properties of the TMR sensor were measured with a vibrating sample magnetometer (VSM). The TMR sensor was then patterned into a width of ~1 μm and a height of ~1 μm, and their TMR properties were measured.

The Ta/Pt—Mn films are deposited in a xenon gas of 0.12 mTorr in multiple-target ion-beam sputtering module 508 of FIG. 5. An ion-beam sputtering mode is used as it provides higher atomic mobility than the DC-magnetron sputtering mode, thus producing a much smoother surface. The smooth interface facilitates the TMR sensor to attain a flat barrier layer, thereby maximizing TMR effects. The Co—Fe/Ru/Co—Fe films are then deposited in an argon gas of 3 mTorr in multiple-target DC-magnetron sputtering module 506. The DC-magnetron sputtering mode is used since it provides much less interface mixing than the ion-beam sputtering mode, thus inducing much stronger antiparallel FM/FM coupling.

A Mg(0.6) film is then deposited in an argon gas of 3 mTorr in multiple-target DC-magnetron sputtering module 506. The same sputtering mode as that used for the deposition of the reference layer is used, so that a lower tunneling interface between the reference and barrier layer can be in-situ protected. The Mg—O(0.3) film is then deposited in mixed xenon and oxygen partial gases of 0.12 and 0.056 mTorr, respectively, in multiple-target ion-beam sputtering module 508. The xenon gas of 0.12 mTorr is introduced from a deposition gun, while the oxygen gas of 0.056 mTorr is introduced from an etch gun. The ion-beam reactive sputtering mode is preferably used since it provides interface mixing, thereby oxygen can also be doped into the underlying Mg film. The Ta/Pt—Mn/Co—Fe/Ru/Co—Fe/Mg/Mg—O films are then exposed to an oxygen gas of 0.5 Torr for 1 minute in oxygen treatment module 510. This mild oxygen treatment is preferably used to oxidize residual Mg atoms in the Mg/Mg—O films, thereby converting the bilayer films into an entire Mg—O film. With this mild oxygen treatment, the oxidation condition may be saturated on the surface of the Mg—O film, so that no active oxygen atoms will react with subsequently deposited Co—Fe/Ni—Fe sense layers.

The Co—Fe/Ni—Fe films are then deposited in an argon gas of 3 mTorr in multi-target DC magnetron sputtering module 506. The DC-magnetron sputtering mode is used so that the interface mixing will not occur at an upper tunneling interface between the barrier and sense layers, thereby preventing degradation of the TMR effects. The Cu/Ta films are then deposited in an argon gas of 3 mTorr in multiple-target DC-magnetron sputtering module 506. The same sputtering mode as that used for the deposition of the sense layers is preferably used, so that the sense layers can be immediately in-situ protected by the Cu/Ta cap layers, thereby ensuring good soft magnetic properties.

As described herein, the three-step barrier-layer formation process eliminates oxygen penetration into the FM sense and pinned layers of the TMR sensor and controls oxygen doping into the barrier layer. The resulting TMR sensor may have the multilayered structure as shown and described in relation to FIG. 1, except that barrier layer 112 is formed according to the method described herein. TMR sensor 100 of the present invention exhibits a high TMR coefficient and controlled magnetic properties. Barrier layer 112 provides a low junction resistance-area product, sufficient to prevent electrostatic discharge (ESD) damage to TMR sensor 100.

Figure 6:
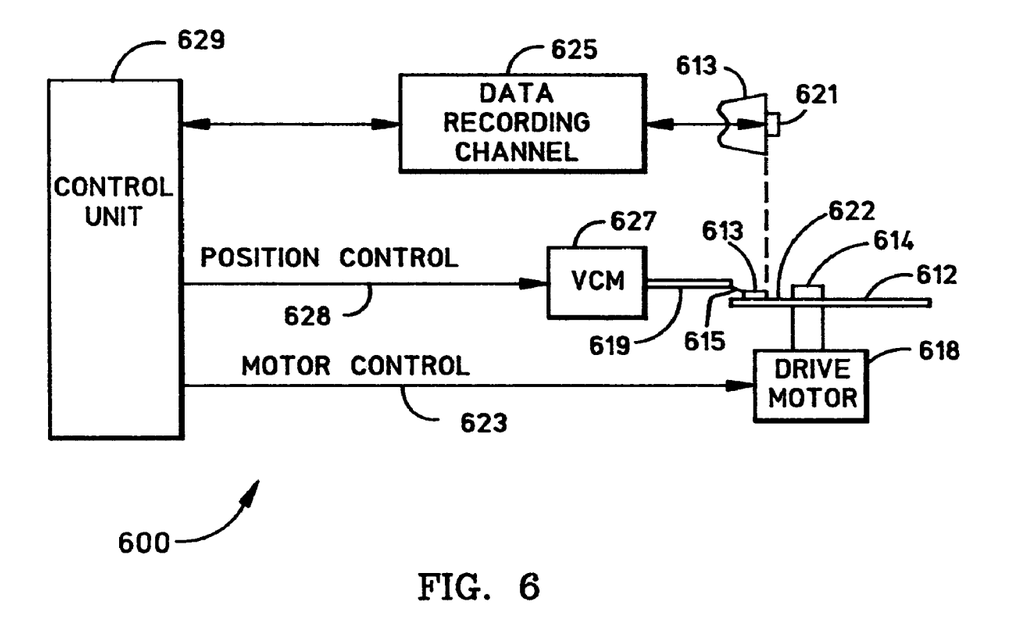
FIG. 6 is an illustration of a magnetic storage system which may utilize the TMR sensor formed using the method described herein.

Referring now to FIG. 6, there is shown a disk drive 600 which has a magnetic head 621 which includes the TMR sensor formed by the methods described herein. As shown in FIG. 6, at least one rotatable magnetic disk 612 is supported on a spindle 614 and rotated by a disk drive motor 618. The magnetic recording media on each disk is in the form of an annular pattern of concentric data tracks (not shown) on disk 612. At least one slider 613 is positioned on the disk 612, each slider 613 supporting magnetic head 621 (i.e. a read/write head) which incorporates the TMR sensor of the present invention. As the disks rotate, slider 613 is moved radially in and out over disk surface 622 so that head 621 may access different portions of the disk where desired data is recorded. Each slider 613 is attached to an actuator arm 619 by means of a suspension 615. The suspension 615 provides a slight spring force which biases slider 613 against the disk surface 622. Each actuator arm 619 is attached to an actuator means 627. The actuator means as shown in FIG. 6 may be a voice coil motor (VCM). The VCM comprises a coil movable within a fixed magnetic field, the direction and speed of the coil movements being controlled by the motor current signals supplied by controller 629.

During operation of the disk storage system, the rotation of disk 612 generates an air bearing between slider 613 (the surface of slider 613 which includes head 621 and faces the surface of disk 612 is referred to as an air bearing surface (ABS)) and disk surface 622 which exerts an upward force or lift on the slider. The air bearing thus counter-balances the slight spring force of suspension 615 and supports slider 613 off and slightly above the disk surface by a small, substantially constant spacing during normal operation. The various components of the disk storage system are controlled in operation by control signals generated by control unit 629, such as access control signals and internal clock signals. Typically, control unit 629 comprises logic control circuits, storage means and a microprocessor. The control unit 629 generates control signals to control various system operations such as drive motor control signals on line 623 and head position and seek control signals on line 628. The control signals on line 628 provide the desired current profiles to optimally move and position slider 613 to the desired data track on disk 612. Read and write signals are communicated to and from read/write head 621 by means of recording channel 625. The above description of a typical magnetic disk storage system, and the accompanying illustration of FIG. 6 are for representation purposes only. It should be apparent that disk storage systems may contain a large number of disks and actuators, and each actuator may support a number of sliders.

Figure 7:
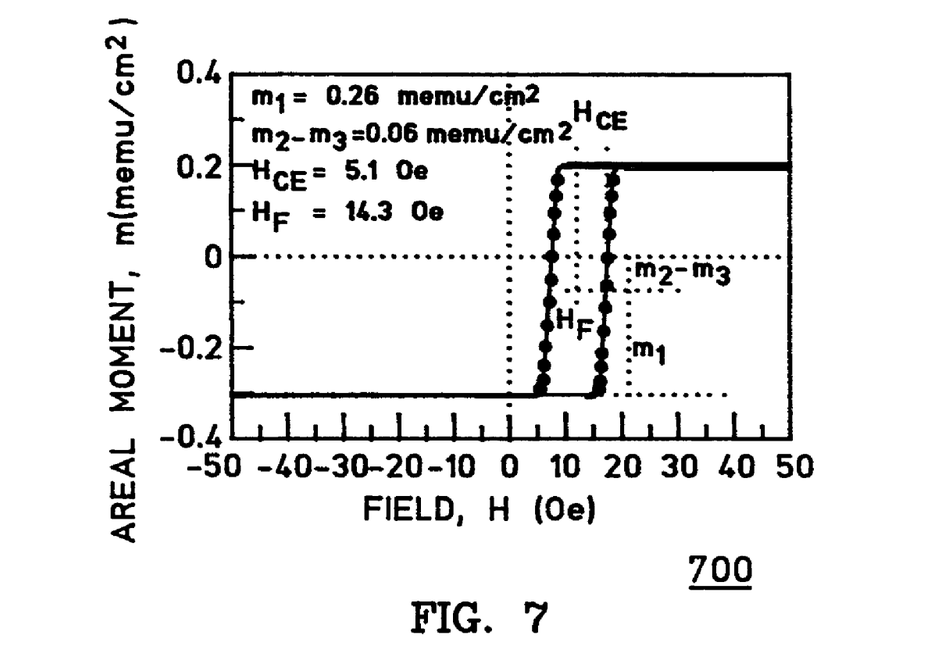
FIGS. 7 and 8 are graphs showing low-field and high-field magnetic responses, respectively, of the TMR sensor formed using the method described herein.
Figure 8:
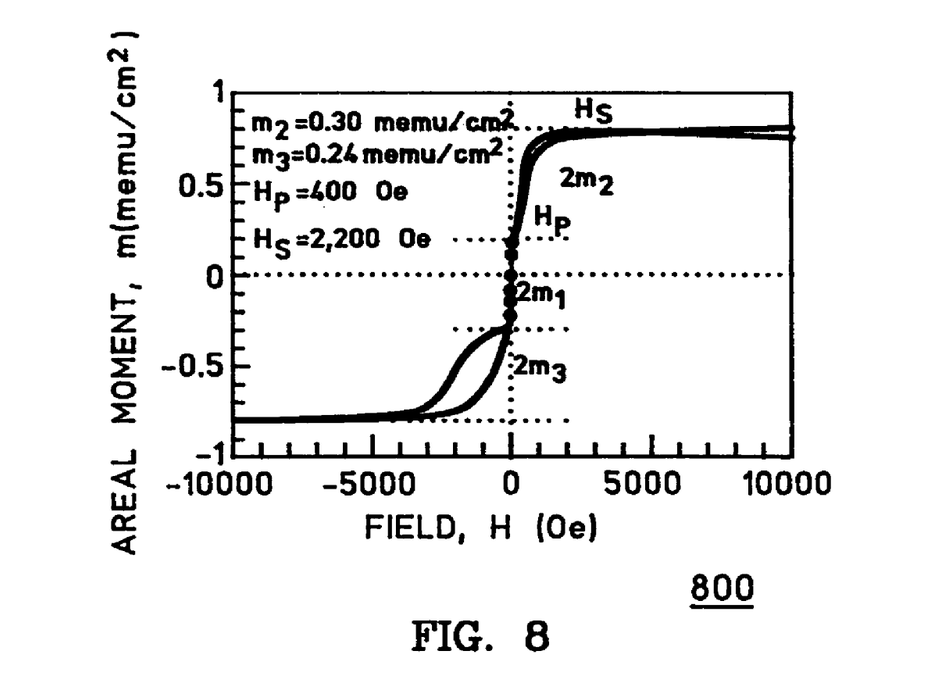
Figure 9:
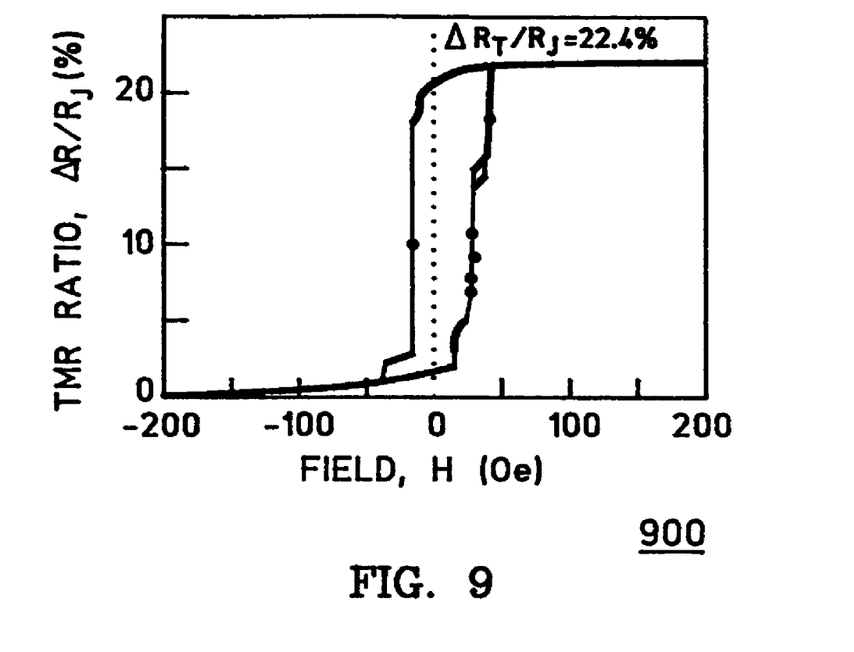
FIGS. 9 and 10 are graphs showing low-field and high-field TMR responses, respectively, of the TMR sensor formed using the method described herein.
Figure 10:
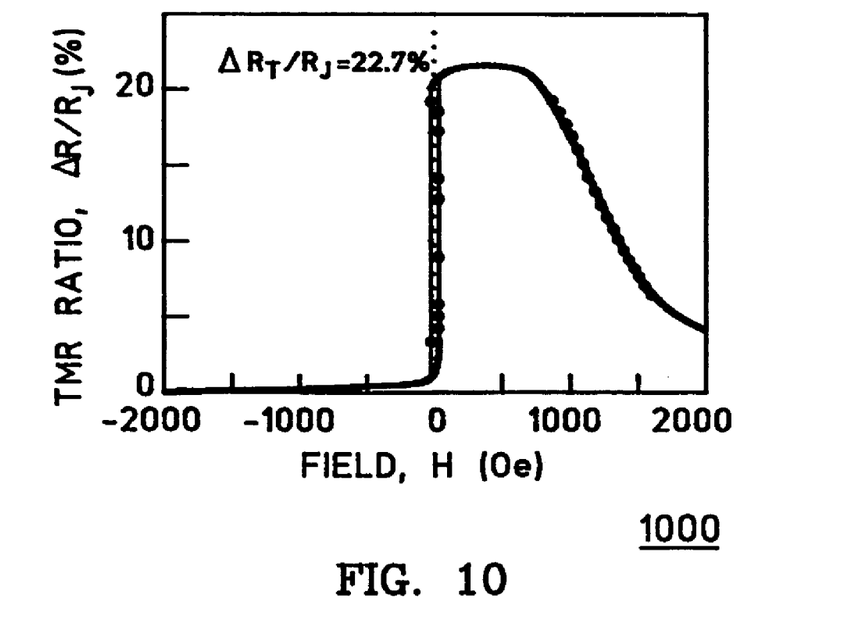
Figure 11:
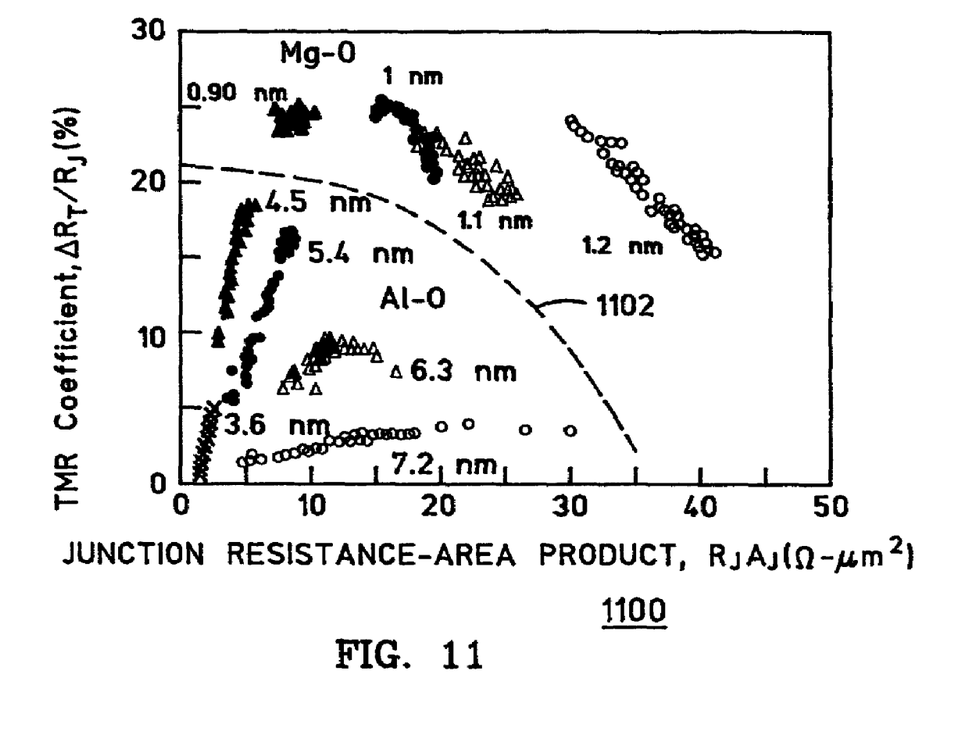
FIG. 11 is a graph showing data points of $\Delta R_T/R_J$ versus $R_J A_J$ for TMR sensors having various $\delta_{Mg-O}$.
Figure 12:
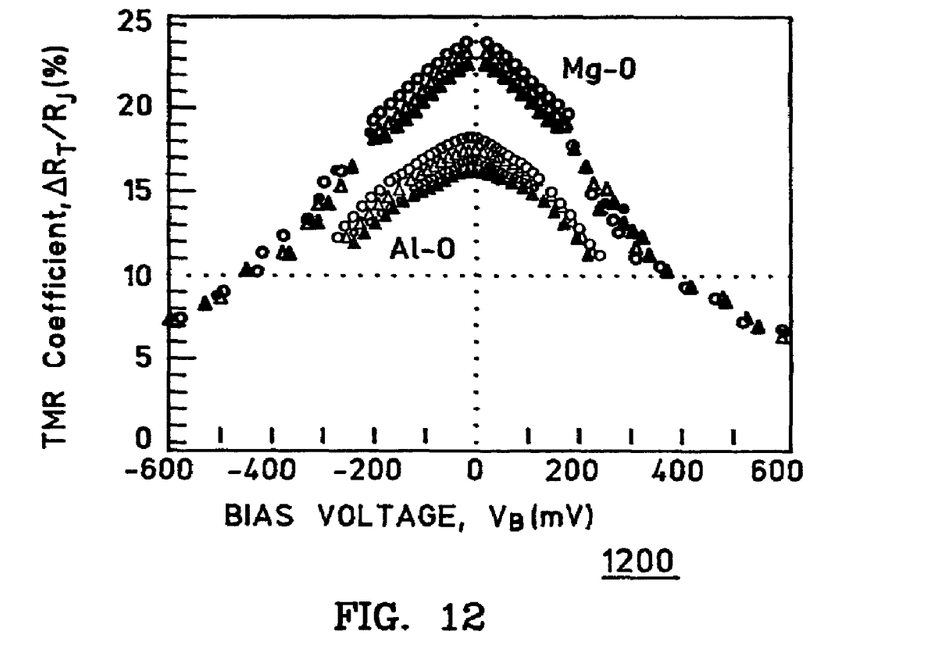
FIG. 12 is a graph showing data points of $\Delta R_T/R_J$ versus a bias voltage for TMR sensors having various $\delta_{Mg-O}$.

FIGS. 7 and 8 are graphs 700 and 800 of low-field and high-field magnetic responses, respectively, of the TMR sensor. The sense layers exhibit an $m_1$ of 0.26 memu/cm², an easy-axis coercivity ($H_{CE}$) of 5.1 Oe, and an $H_F$ of 14.3 Oe. The reference and keeper layers exhibit a net areal moment ($m_2-m_3$) of 0.06 memu/cm$^2$, an $H_{SF}$ of 400 Oe, and an $H_S$ of 2,200 Oe. FIGS. 9 and 10 are graphs 900 and 1000 of corresponding low-field and high-field TMR responses, respectively, of the TMR sensor. The $\Delta R_T/R_J$ reaches as high as 22.7%. FIG. 11 is a graph 1100 showing data points of $\Delta R_J/R_J$ versus $R_JA_J$ for TMR sensors having various $\delta_{Mg-O}$. With an optimal $\delta_{Mg-O}$ of 0.9 nm, the TMR sensor exhibits $R_JA_J$ ranging from 6.9 to 9.6 $\Omega$-$\mu$m$^2$, and a $\Delta R_T/R_J$ ranging from 22.8 to 25.8%. A larger $\delta_{Mg-O}$ leads to an unacceptable high $R_JA_J$ and a slightly lower $\Delta R_T/R_J$. These TMR properties are far better than those of the conventional TMR sensor with the Al—O barrier layer. FIG. 12 is a graph 1200 showing data points of $\Delta R_T/R_J$ versus a bias voltage for TMR sensors having various $\delta_{Mg-O}$. The $V_C$ is around 450 mV, indicating higher thermal stability than the TMR sensor with the Al—O barrier layer.

Alternative Embodiments. The oxygen doping and treatment used in the three-step barrier-layer formation process must be optimized in order to prevent residual Mg atoms from reacting with underlying reference layer and to prevent excess oxygen from penetrating into the underlying reference layer. While both $\Delta R_T/R_J$ and $V_C$ described in the preferred embodiment are very high for the use of the TMR sensor in magnetic recording at high densities, the $R_JA_J$ is considered to be not low enough for the use of the TMR sensor in magnetic recording at ultrahigh densities. $R_JA_J$ is preferably below 4 $\Omega$-$\mu$m$^2$, so that when the TMR sensor is miniaturized to as small as 0.2 $\mu$m×0.2 $\mu$m, the $R_J$ can be below 100$\Omega$. To further decrease $R_JA_J$ while maintaining high $\Delta R_T/R_J$ and $V_C$, enhancements may be much desired for each step of the three-step barrier-layer formation process.

The deposition of the Mg film is needed to in-situ protect the underlying reference layer from oxygen penetration into the reference layer during the subsequent reactive sputtering process. Without this deposition, the oxygen gas used for the reactive sputtering process will penetrate into the reference layer, thus decreasing its areal moment and deteriorating pinning properties. It should be thick enough to cover the reference layer, but not so thick as to prevent the existence of unwanted residual Mg atoms after the three-step barrier-layer formation process. Hence, the thickness of the Mg film preferably ranges from 0.4 to 1 nm.

Figure 13:
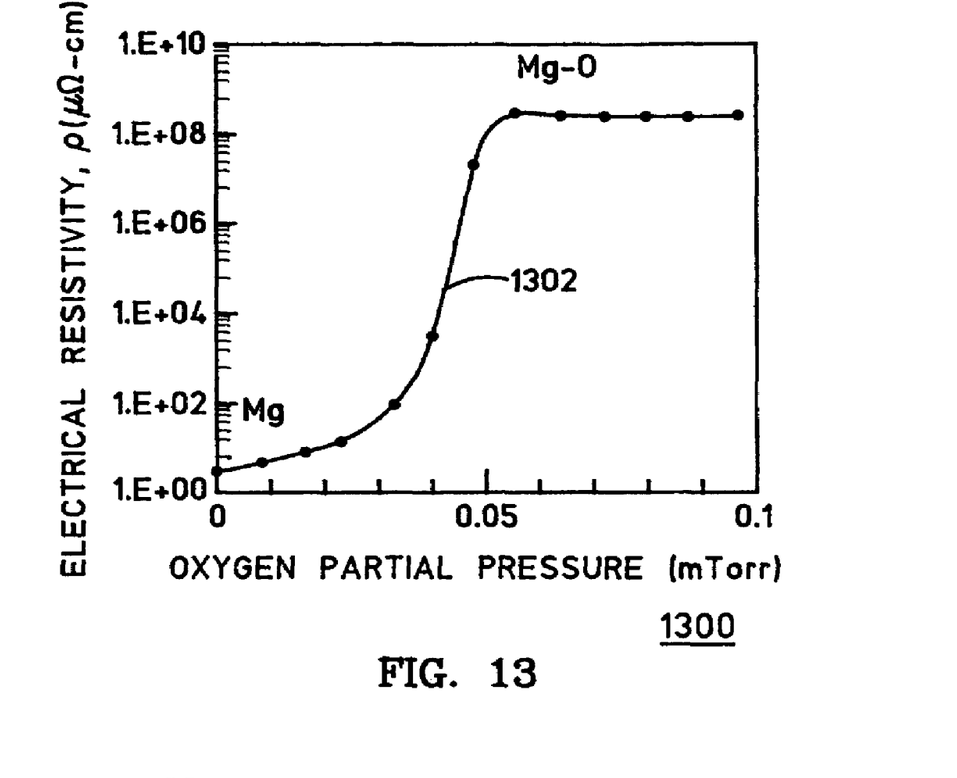
FIG. 13 is a curve showing the electrical resistivity of the Mg—O film (ρ) versus an oxygen partial pressure.

The reactive sputtering process is used not only for the deposition of the Mg—O film, but also for the oxygen doping into the underlying Mg film. Referring ahead to FIG. 13, a graph 1300 showing a curve 1302 of the electrical resistivity of the Mg—O film ($\rho$) versus an oxygen partial pressure is shown. For the oxygen partial pressure ranging from 0 to 0.056 mTorr, some Mg atoms do not react with the oxygen gas. For the oxygen partial pressure ranging from 0.056 to 0.08 mTorr, all the Mg atoms react with the oxygen gas and some excessive oxygen atoms may be also doped into the previously deposited Mg film. For the oxygen partial pressure of beyond 0.08 mTorr, more excessive oxygen atoms may penetrate through the underlying Mg film and into the reference layer, resulting in a $H_F$ of beyond 30 Oe. Hence, the reactive sputtering process should be optimized by utilizing the oxygen partial pressure ranging from 0.056 to 0.08 mTorr. It should be noted that the use of a high oxygen partial pressure may cause "poisoning" of the Mg target, i.e., forming a thin oxide on the Mg target so that it becomes difficult to sputter this Mg target again. It is thus desirable to use one Mg target preferably in one module only for the deposition of the Mg film, and to use another Mg target preferably in another module only for the deposition of the Mg—O film.

Figure 14:
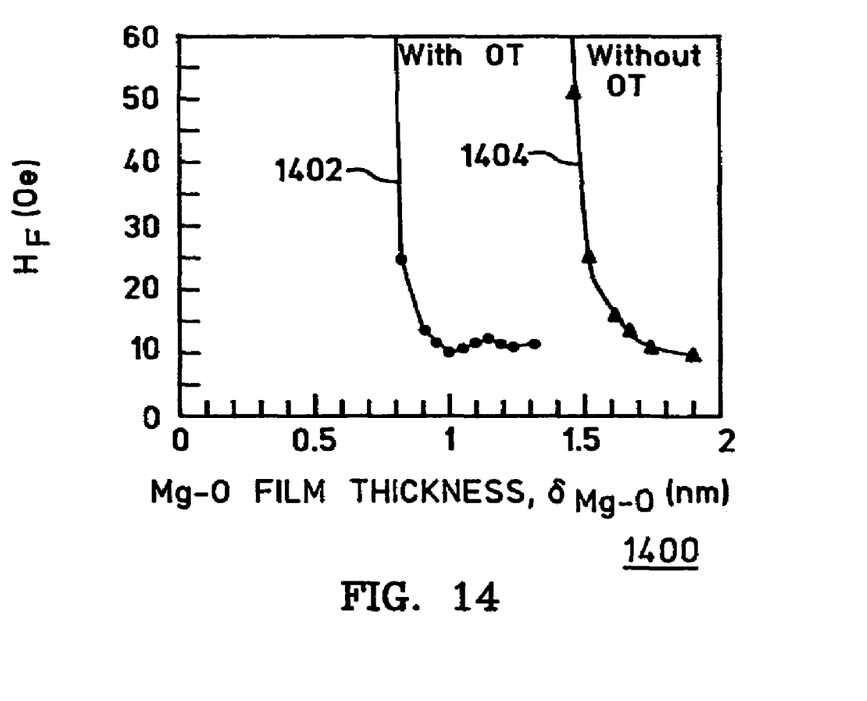
FIG. 14 are curves of $H_F$ versus $\delta_{Mg-O}$ for the TMR sensors with and without oxygen treatment.

The oxygen treatment minimizes difficulties otherwise present in controlling the reactive sputtering process and in preventing the Mg target from the poisoning. It should be in-situ, natural and mild. All residual Mg atoms in the Mg and Mg—O films must be oxidized after this oxygen treatment. In FIG. 14, a graph 1400 showing $H_F$ versus $\delta_{Mg-O}$ for TMR sensors with oxygen treatment (a curve 1402) and without oxygen treatment (a curve 1404) is shown. The use of the oxygen treatment substantially decreases the $H_F$. It has been found that similar TMR properties can be attained after reducing the oxygen partial pressure from 0.056 to 0.04 mTorr while increasing the oxygen treatment time from 1 to 4 minutes. Hence, with the oxygen treatment, the TMR sensor fabrication process becomes more controllable.

Even oxygen doping and treatment are very carefully optimized in the three-step barrier-layer formation process, few oxygen atoms still inevitably penetrate into the underlying Co—Fe reference layer, thus deteriorating $H_P$. To minimize this $H_P$ deterioration, the Co—Fe reference layer is preferably thicker and the annealing temperature is preferably lower. The keeper layer must be also correspondingly thicker to maintain the same net areal moment of the reference and keeper layers for optimal TMR responses. Alternatively, the TMR sensor comprising Ta(6)/Pt—Mn(20)/Co—Fe(2)/Ru(0.8)/Co—Fe(2.2)/Mg—O(0.8)/Co—Fe(1)/Ni—Fe(1.6)/Cu(1)/Ta(12) films are annealed for 5 hours at 240° C., and its magnetic and TMR properties are measured with the VSM. It should be noted that a thinner Mg—O barrier layer is used in this TMR sensor for further reducing $R_JA_J$, which typically decreases exponentially with the barrier-layer thickness.

Figure 15:
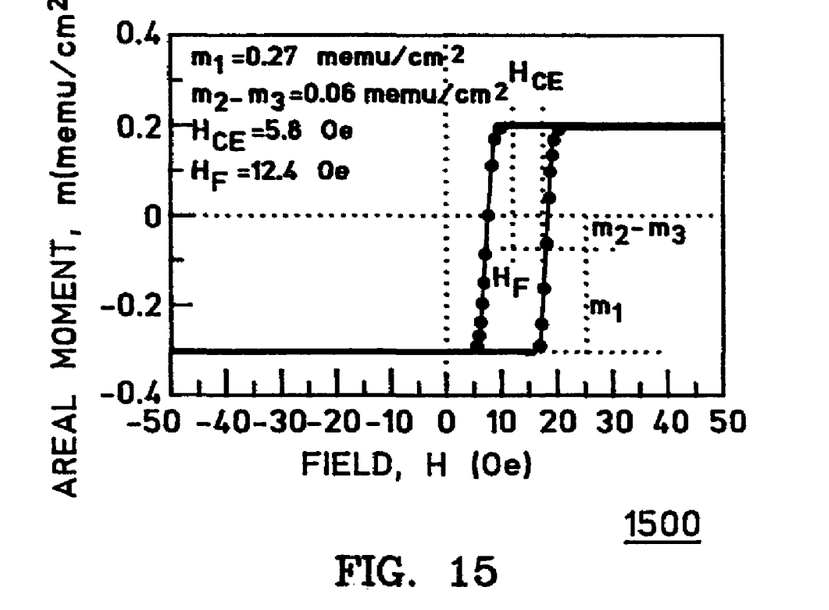
FIGS. 15 and 16 are graphs showing low-field and high-field magnetic responses, respectively, of the alternative TMR sensor formed using the method described herein.
Figure 16:
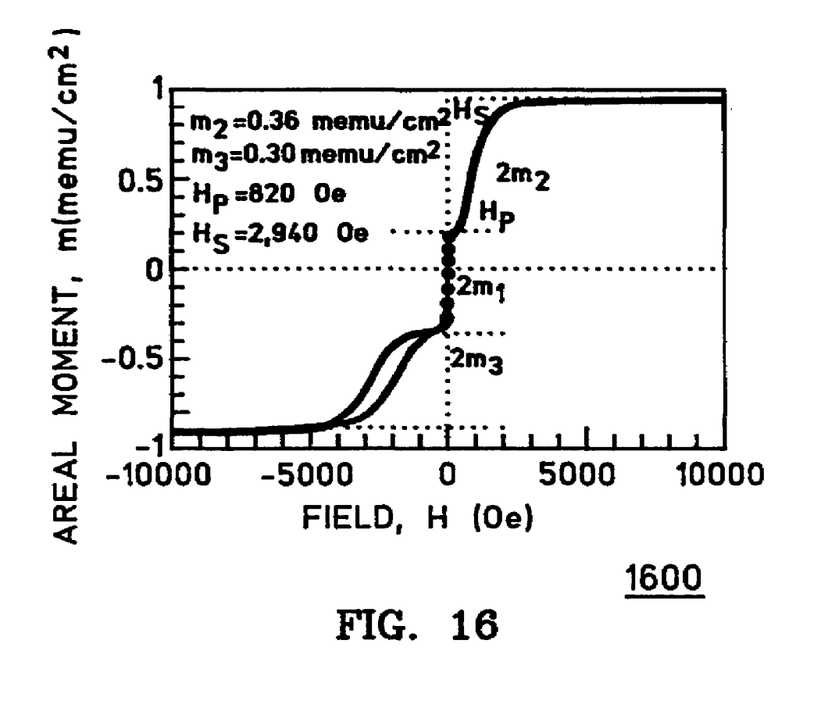

FIGS. 15 and 16 are graphs 1500 and 1600 of low-field and high-field magnetic responses, respectively, of the TMR sensor. The sense layers exhibit an $m_1$ of 0.27 memu/cm$^2$, an $H_{CE}$ of 5.8 Oe, and an $H_F$ of 12.4 Oe. The reference and keeper layers exhibit $m_2-m_3$ of 0.06 memu/cm$^2$, an $H_P$ of 820 Oe, and an $H_S$ of 2,940 Oe. Evidently, the uses of the thicker reference layer and lower annealing temperature substantially increases $H_P$.

Figure 17:
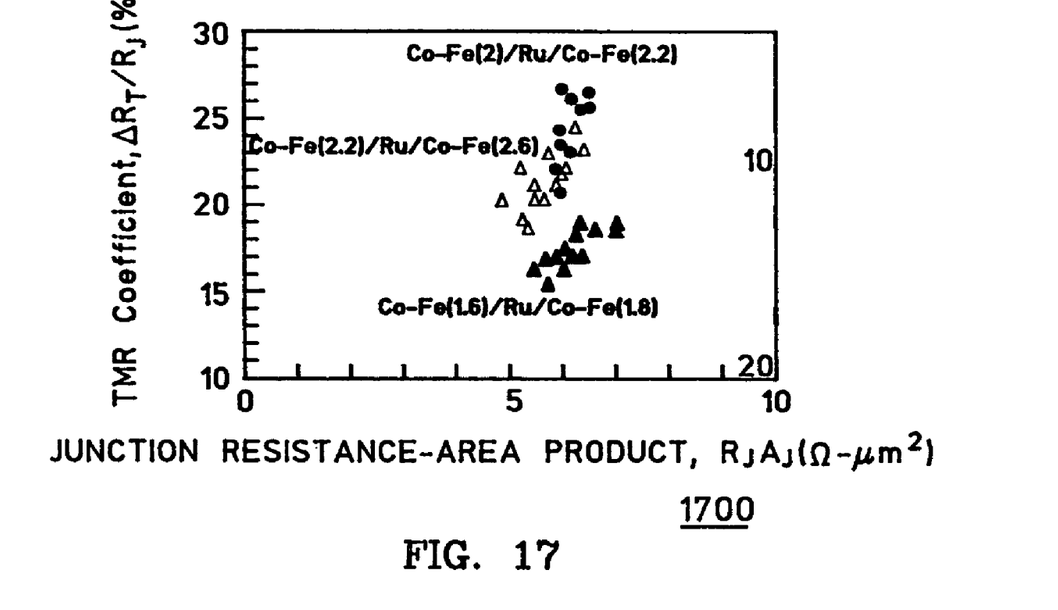
FIG. 17 is a graph showing data points of $\Delta R_T/R_J$ versus $R_J A_J$ for TMR sensors having various reference layer thicknesses.
Figure 18:
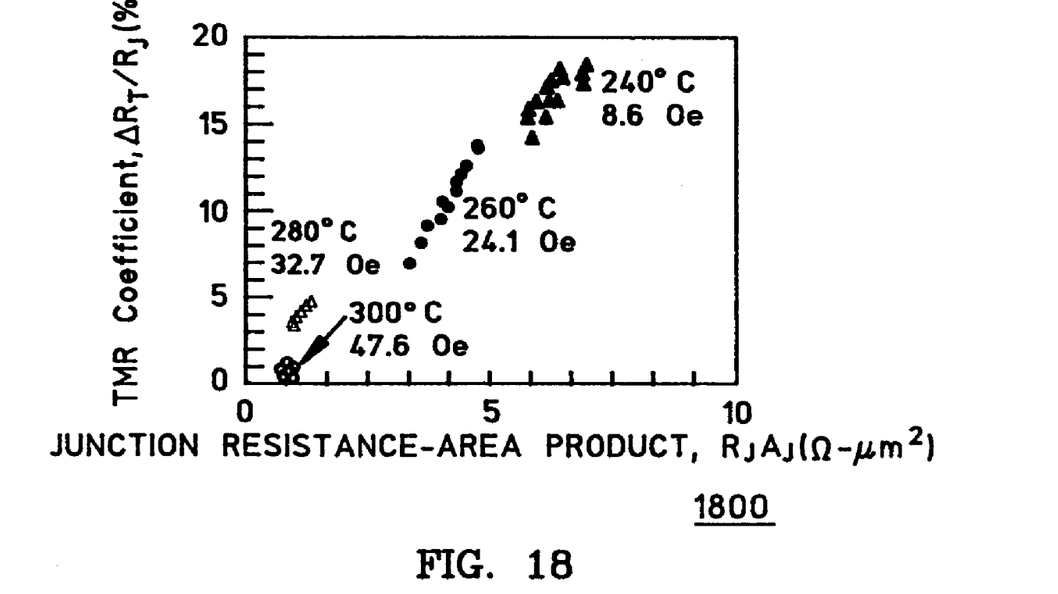
FIG. 18 is a graph showing data points of $\Delta R_T/R_J$ versus $R_J A_J$ for TMR sensor annealed at various temperatures.

More importantly, the uses of the thicker reference layer and lower annealing temperature also causes a substantial increase in $\Delta R_T/R_J$. FIG. 17 is a graph 1700 showing data points of $\Delta R_T/R_J$ versus $R_JA_J$ for TMR sensors having various reference-layer thicknesses. As the reference-layer thickness increases to an optimal values (about 2.2 nm), $\Delta R_J/R_J$ substantially increases to a maximum value, while maintaining nearly constant $R_JA_J$. FIG. 18 is a graph 1800 showing data points of $\Delta R_T/R_J$ versus $R_JA_J$ for TMR sensors annealed at various temperatures. A lower annealing temperature leads to a lower $H_F$ (shown in the graph) and a higher $\Delta R_T/R_J$. A higher annealing temperature seems to have an advantage of decreasing $R_JA_J$, but in fact the Mg—O barrier layer is thermally interrupted, leading to a higher $H_F$ and a lower $\Delta R_T/R_J$. Hence, the annealing temperature preferably ranges from 240 to 280° C.

It should be noted that, a thinner Mg—O barrier layer is used in this TMR sensor for further reducing $R_JA_J$. This thinner Mg—O barrier layer can be successfully used, since $H_F$ can be very well controlled by utilizing a lower annealing temperature.

Thus, a method of forming a barrier layer of a TMR sensor has been described. The method includes the acts of depositing a metallic film over a FM layer; depositing an oxygen-doped metallic film over the metallic film; and performing an oxygen treatment on the oxygen-doped metallic film. The FM layer may be, for example, a reference layer or one of the sense layers of the TMR sensor. The act of depositing the metallic film may be performed within a first module (e.g. a DC magnetron sputtering module) and the act of depositing the oxygen-doped metallic film may be performed within a second module (e.g. an ion beam sputtering module). Also, the act of depositing the metallic film may be performed within the same module used to deposit the FM layer (e.g. the DC magnetron sputtering module). Preferably, the metallic film is magnesium and the oxygen-doped metallic film is oxygen-doped magnesium. If magnesium is used for the metallic film, the resulting TMR sensor includes a first FM layer, a barrier layer made of magnesium-oxide (Mg—O) formed over the first FM layer, and a second FM layer formed over the barrier layer. The ferromagnetic sense and pinned layers of the TMR exhibit controlled magnetic properties, the barrier layer provides a low junction resistance-area product, and the TMR sensor exhibits a high TMR coefficient. Advantageously, the junction resistance is sufficiently low enough to prevent electrostatic discharge (ESD) damage to submicron-sized TMR sensors used for magnetic recording at ultrahigh densities.

The above is merely a description of preferred embodiments of the invention and it is understood that various changes, alterations, and variations may be made without departing from the true spirit and scope of the invention as set for in the appended claims. For example, although the method describes a three-step barrier-layer formation process, additional intervening steps may be devised to form the barrier layer. None of the terms or phrases in the specification and claims has been given any special particular meaning different from the plain language meaning to those skilled in the art, and therefore the specification is not to be used to define terms in an unduly narrow sense.

What is claimed is:

1. A tunneling magnetoresistive (TMR) sensor, comprising:
    a first ferromagnetic (FM) layer;
    a barrier layer formed over the first FM layer, wherein the barrier layer comprises magnesium-oxide (Mg—O); and
    a second FM layer formed over the barrier layer;
    wherein the barrier layer has a structure corresponding to depositing a first film comprising magnesium over the first FM layer, depositing a second film comprising oxygen-doped magnesium over the first film, and performing an oxygen treatment on the barrier layer.

2. The TMR sensor of claim 1, further comprising:
    the first FM layer used as a reference layer; and
    the second FM layer used as one of a plurality of sense layers.

3. The TMR sensor of claim 2, wherein the barrier layer includes a portion having a structure corresponding to interface mixing created during deposition of the second film over the first film.

4. The TMR sensor of claim 1, further comprising:
    the first FM layer used as one of a plurality of sense layers; and
    the second FM layer used as a reference layer.

5. The TMR sensor of claim 1, wherein an upper surface of the barrier layer is in a saturated oxidation condition.

6. The TMR sensor of claim 1, further comprising:
    an antiferromagnetic (AFM) pinning layer.

7. The TMR sensor of claim 1, wherein the barrier layer includes a portion having a structure corresponding to interface mixing created during deposition of the second film over the first film.

8. A magnetic head, comprising:
    a tunneling magnetoresistive (TMR) sensor; the TMR sensor including:
        a first ferromagnetic (FM) layer;
        a barrier layer formed over the first FM layers, wherein the barrier layer comprises magnesium-oxide (Mg—O), the barrier layer being a single continuous structure having structural characteristics corresponding to formation of an oxygen-doped film over a magnesium metallic film such that interface mixing occurred between the films during formation thereof; and
        a second FM layer formed over the barrier layer.

9. The magnetic head of claim 8 wherein, for the TMR sensor, the first FM layer is used as a reference layer and the second FM layer is used as one of a plurality of sense layers.

10. The magnetic head of claim 8 wherein, for the TMR sensor, the first FM layer is used as one of a plurality of sense layers and the second FM layer is used as a reference layer.

11. The magnetic head of claim 8, wherein an upper surface of the barrier layer is in a saturated oxidation condition.

12. The magnetic head of claim 8, wherein the TMR sensor further comprises:
    an antiferromagnetic (AFM) pinning layer under which the first FM layer, the barrier layer, and the second FM layer are formed.

13. The magnetic head of claim 8 wherein, for the TMR sensor, the barrier layer is formed by performing an oxygen treatment on the barrier layer.

14. A disk drive, comprising:
    at least one magnetic disk;
    a spindle which supports the at least one magnetic disk;
    an actuator arm;
    a slider which is attached to the actuator arm;
    a magnetic head supported by the slider; the magnetic head including:
        a tunneling magnetoresistive (TMR) sensor; the TMR sensor including:
            a first ferromagnetic (FM) layer;
            a barrier layer formed over the first FM layer, wherein the barrier layer comprises magnesium-oxide (Mg—O), and wherein the barrier layer has a structure corresponding to deposition of a first film comprising magnesium over the first FM layer, deposition of a second film comprising oxygen-doped magnesium over the first film, and performance of an oxygen treatment on the barrier layer; and
            a second FM layer formed over the barrier layer.

15. The disk drive of claim 14 wherein, for the TMR sensor, the first FM layer is used as a reference layer and the second FM layer is used as one of a plurality of sense layers.

16. The disk drive of claim 14, further comprising:
    the first FM layer used as one of a plurality of sense layers; and
    the second FM layer used as a reference layer.

17. The disk drive of claim 14, wherein an upper surface of the barrier layer is in a saturated oxidation condition.

18. The disk drive of claim 15, wherein the barrier layer includes a portion having a structure corresponding to interface mixing created during deposition of the second film over the first film.

19. The disk drive of claim 14, further comprising:
    an antiferromagnetic (AFM) pinning layer.

20. The disk drive of claim 14, wherein the barrier layer includes a portion having a structure corresponding to interface mixing created during deposition of the second film over the first film.

* * * * *